United States Patent [19]

Rogers et al.

[11] Patent Number: 4,864,535
[45] Date of Patent: Sep. 5, 1989

[54] ENTRY POINT ADDRESS CIRCUIT FOR MICROCODE ROM

[75] Inventors: William C. Rogers; William S. Ruszczyk, both of Dallas, Tex.

[73] Assignee: Texas Instruments Incorporated, Dallas, Tex.

[21] Appl. No.: 806,118

[22] Filed: Dec. 6, 1985

[51] Int. Cl.[4] .............................................. G11C 7/00
[52] U.S. Cl. ...................................................... 365/94
[58] Field of Search ... 364/200 MS File, 900 MS File; 365/94–105, 189, 230

[56] References Cited

U.S. PATENT DOCUMENTS

| | | | |
|---|---|---|---|
| 3,949,370 | 4/1976 | Reyling, Jr. et al. | 364/200 |
| 4,032,765 | 6/1977 | Epstein | 365/103 |
| 4,095,278 | 6/1978 | Kihara | 364/900 |
| 4,300,208 | 11/1981 | Jasmin et al. | 364/900 |
| 4,336,602 | 6/1982 | Kruger | 364/900 |
| 4,370,729 | 1/1983 | Bosch | 364/200 |
| 4,428,047 | 1/1984 | Hayh et al. | 364/200 |
| 4,434,465 | 2/1984 | McDonough et al. | 364/200 |
| 4,734,885 | 3/1988 | Luich | 365/103 |
| 4,802,126 | 1/1989 | Takayama | 365/94 |

Primary Examiner—Gareth D. Shaw
Assistant Examiner—John G. Mills
Attorney, Agent, or Firm—Melvin Sharp; Thomas W. DeMond; Lawrence J. Bassuk

[57] ABSTRACT

A multiplexer (76) for coupling selected instruction word bits to a microcode memory (22) as entry point addresses. The multiplexer (76) receives sixteen bits from an instruction word register (10) and, for normal word formats, couples the opcode (40) portion unchanged to the memory (22) as an entry point address. For special instruction word formats, various bits of the instruction word fields form an entry point address, while other bits are modified and coupled to memory (22) as column addresses to access selected memory sections.

8 Claims, 4 Drawing Sheets

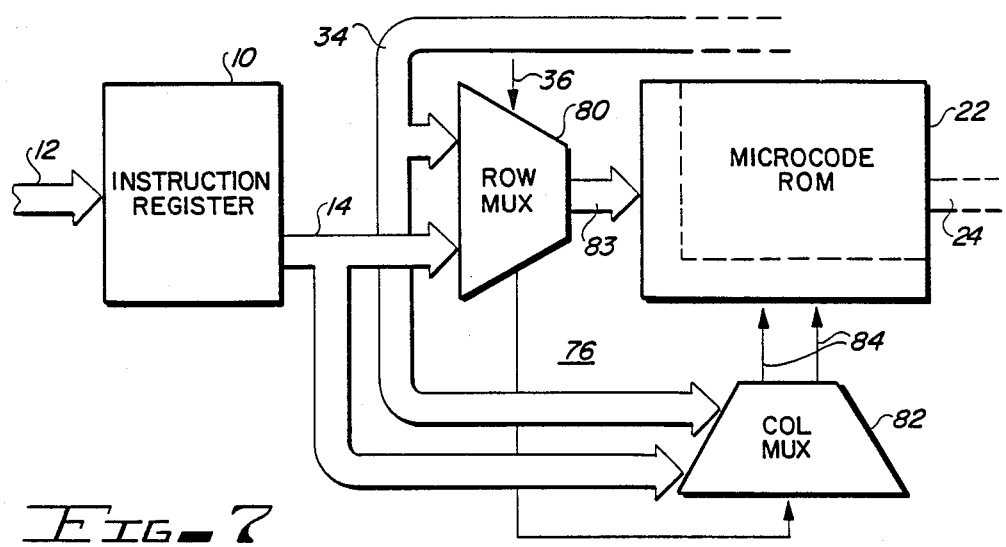
_FIG-7_
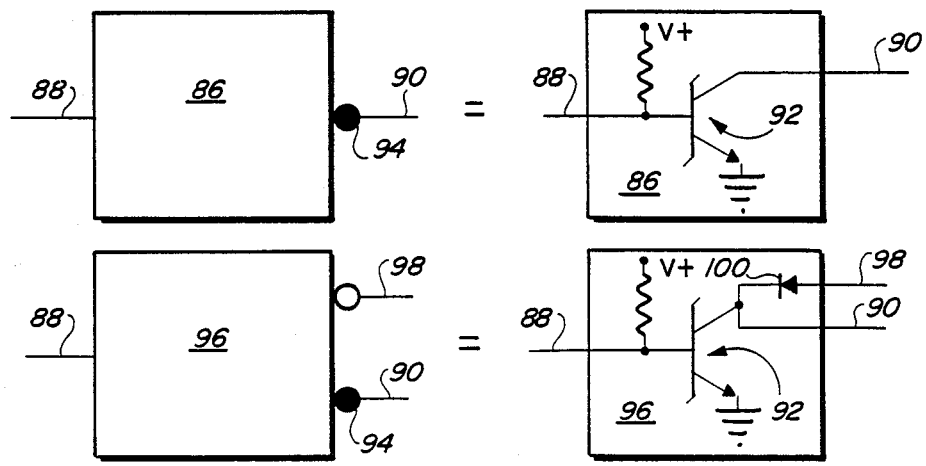
_FIG-8_
| | S/B | ENA | ENB | ENC | END | ENE | MPX INPUT/OUTPUT | RAD(0-7) | CAD(0,1) |
|---|---|---|---|---|---|---|---|---|---|
| 186 | 0 | 0 | 0 | 0 | 0 | 1 | NEXT STATE ADDRESS | NSA(2-9) | NSA(0,1) |
| 188 | 1 | 1 | 0 | 0 | 0 | 0 | NORMAL FORMAT | IWB(0-7) | 00 |
| 190 | 1 | 1 | 1 | 0 | 0 | 0 | BASE RELATIVE | IWB(0-5)11 | 00 |
| 192 | 1 | 0 | 0 | 1 | 0 | 0 | BASE RELATIVE INDEX | 0111IWB(8-11) | 10 |
| 194 | 1 | 0 | 0 | 0 | 1 | 0 | IMMEDIATE LONG | 0011IWB(12-15) | 01 |
_FIG-10_

ENTRY POINT ADDRESS CIRCUIT FOR MICROCODE ROM

TECHNICAL FIELD OF THE INVENTION

The present invention relates in general to computer processors, and more particularly relates to entry point address generation circuits and techniques related thereto.

BACKGROUND OF THE INVENTION

The utility of a program controlled processor is related to the number and type of instructions which are used to control the various circuits of the processor. Each type of processor, for example a microprocessor, includes a finite number of instructions, each of which can be used in a program to control the microprocessor circuits to accomplish a desired task. Microprocessor instruction sets typically include instructions in the nature of fetch, move data, compare, add, subtract, etc.

Each of the instructions comprising an instruction set must be decoded by the microprocessor into binary signals recognized by the processing circuitry to carry out the specific function. More commonly, the microprocessor decodes each instruction into a unique entry point address to a microcode memory which is the starting point for carrying out the specific function. In essence, the entry point address for each instruction is the starting point of a sequence of subsequent memory read and write operations which yield output data and electrical signals directed to arithmetic logic units and other registers. The overall end result is the accomplishment of the function defined by the instruction. The microcode memory is generally in the nature of a Read Only Memory (ROM) preprogrammed so as to be responsive to each instruction of the entire set for providing the necessary output data and signals. In progressing through the concatenation of operations, various addressed memory locations have stored therein data representative of other addresses with which the memory must be addressed to yield data or yet other addresses for carrying out the desired function in accordance with the instructions.

As the microprocessor steps through instructions of the application program, each such program instruction is stored in an instruction register. A Programmable Logic Array (PLA) is conventionally employed to convert the binary bits stored in the instruction register to an address of the microcode ROM which is the entry point for that instruction. The PLA is configured or programmed to convert each instruction of the entire set into a different entry point address for the microcode ROM. The PLA is customarily programmed so that the entry points for the instructions are located adjacently in a small section of the microcode ROM.

While the conventional approach of using a PLA provides adequate decoding capabilities, the plural levels of logic contribute significantly to the overall delay in providing a decoded address for the microcode memory. In some cases, the PLA is provided with an output latch, in which event one processing clock cycle may be required to provide a decoded entry point address. This overall delay in the instruction pipeline must be encountered during the execution of each instruction. Also, because the decoding of column addresses of conventional ROMs is inherently slower than row address decoding, the delay in the instruction pipeline is affected accordingly. Self tests of microprocessors are employed many times to assure the integrity of the microcode memory contents. When PLAs are used as the instruction word binary bit converter, additional instruction word register hardware is necessary to provide the self tests, and multiple sequences are needed.

In view that the trend is toward the construction of faster processing equipment, it can be seen that a need has arisen for an instruction decoding technique which does not burden the processing system with excessive delay, with additional hardware for test sequences, or with an additional clock cycle. From the foregoing, there is also an associated need for an instruction decoder which accommodates various types of instruction formats without a substantial increase in the complexity of the circuit, nor a compromise in the decoding speed.

SUMMARY OF THE INVENTION

In accordance with the present invention, a method and circuit for decoding instructions are provided which substantially reduce or eliminate the disadvantages associated with the prior art techniques.

According to the invention, and for general instruction word formats, an instruction word multiplexer applies the binary bits of the instruction word directly to the microcode memory as the entry point address for that instruction. In this manner, the binary characterization of the instruction word is applied, without change, to the microcode memory. For special instruction word formats, the multiplexer is responsive to the unique pattern of instruction word bits corresponding to the special format, for modifying some of the instruction word bits coupled to the microcode memory. In the preferred form of the invention the microcode memory is addressable by columns and rows, with selected word bits being used so that the memory column addresses are the same for a given special instruction word format.

In another embodiment of the invention, the multiplexer is provided with a control signal, and another set of inputs for "next state addresses". The control signal is operative to switch either the instruction word bits or the next state addresses to the microcode memory. The multiplexer is constructed with only a few levels of combinational logic gates which provide a fast throughput of the input signals to the output thereof. The column addresses are generated after not more than two gate delays, thereby offsetting the slow column address decoding by the microcode memory. Further speed advantage of the decoder is gained by using Schottky transistor logic gates.

BRIEF DESCRIPTION OF THE DRAWINGS

Further features and advantages of the present invention will become apparent from the description of an illustrative embodiment thereof, taken in conjunction with the accompanying drawings, in which:

FIG. 7 is a block diagram of the entry point address multiplexer architecture according to the invention, illustrating the instruction row and column multiplexers coupled to the memory;

FIG. 8 illustrates in schematic form logic gate symbols of the invention;

FIG. 10 is a table depicting signal conductors of the multiplexer enabled in response to instruction word formats.

DETAILED DESCRIPTION OF THE INVENTION

Figure 1:
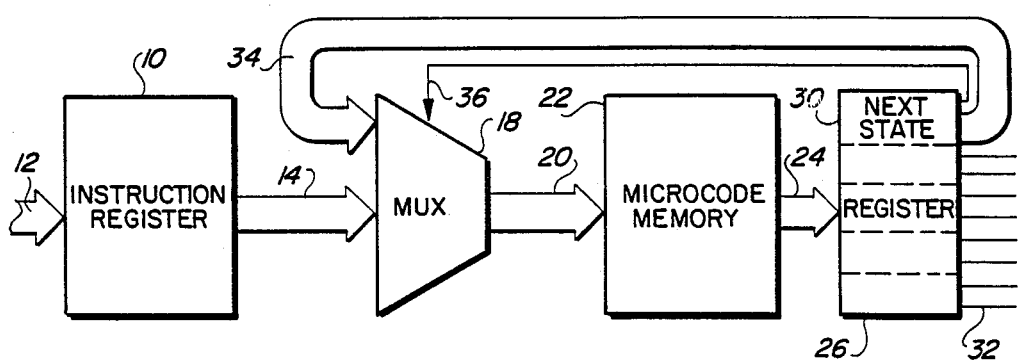
FIG. 1 is a block diagram of the instruction word multiplexer shown in a computer processor environment.

The application of the invention is best understood by referring first to FIG. 1 of the drawings. A multibit instruction word register 10 stores an instruction word received on an input bus 12. Each bit of the instruction can be read out of the instruction register 10 on an output bus 14. While not shown, input/output control is provided for controlling the input and output functions of the instruction register 10 to store each instruction word and output such words on demand.

Central to a principal feature of the invention, there is provided a multiplexer 18. The multiplexer 18 has an input connected to the register output bus 14, and thereby receives the instruction word bits in parallel form. The output of the multiplexer 18 is coupled by a parallel bus 20 to the address inputs of a microcode memory 22. The microcode memory 22 is of conventional design, and may comprise a ROM type of memory. A data bus 24 couples the output of the microcode memory 22 to a storage register 26 for storing data words read from the memory 22. The memory 22 is read in accordance with the presence of addresses on bus 20. The data register 26 is constructed with various segments, one shown as reference character 30. Each segment of the data word stored in register 26 represents control information directed to other processor circuitry, such as arithmetic logic, a sequencer, registers, etc.

Collectively, these other circuits receive the data word segments on conductors 32, and are responsive to the microcode memory data to carry out a desired function corresponding to the instruction word. One segment 30 of the data register 26 stores the "next state" information read from the memory 22 as part of the data word. The next state segment 30 is coupled by a bus 34 to the next state input of the multiplexer 18. The next state address may also be coupled back to the memory 22 through the multiplexer 18 as row address information. An input bus select control line 36 is connected between the next state segment 30 to the multiplexer 18, and controls whether the next state address on bus 34, or the instruction word on bus 14, will be output on bus 20 to the microcode memory 22. The multiplexer 18 is situated between the instruction register 10 and the microcode memory 22, and provides a substantial improvement in performance over the programmable logic array noted above.

The entry point address circuit shown in FIG. 1 functions in the following manner. As the various instruction words of the application program are read by the microprocessor control unit (not shown), such words are stored in the instruction register 10. When the microprocessor is ready to execute the instruction stored in register 10, the instruction word bits are transferred on bus 14 to the multiplexer 18. Of primary importance to the invention, the multiplexer 18 presents the instruction word bits unchanged, or slightly modified, as entry point addresses on bus 20 to the microcode memory 22. Departing from the practices heretofore known in the art, the multiplexer 18 is characterized by very few logic levels and thus has a very low input-output delay. Also, the multiplexer 18 is asynchronous and thus does not depend upon a microprocessor clock cycle for converting or translating instruction word bits into entry point addresses.

The microcode memory 22 is read in accordance with the entry point address on bus 20, and the data stored at the corresponding address location is stored in output register 26. It should be understood that for the execution of each instruction word, and thus for each corresponding entry point address, many locations of the microcode ROM 22 will be accessed to provide data to other circuits to complete the function specified by the instruction word. Essentially, the entry point address presented to the microcode ROM 22 triggers a sequence of subsequent ROM read operations of predefined locations. Some of these locations will contain the next state which, when presented to the memory 22 through bus 34 and multiplexer 18, provide the iterative process for carrying out the overall function specified by the instruction word.

Figure 2:
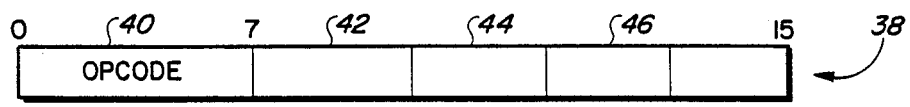
FIGS. 2-5 illustrate various fields of exemplary instruction word formats described in connection with the invention.

The instruction word sets of microprocessors currently marketed include as many as 256 instructions Eight bits of binary information can be used to represent these 256 instruction words. Accordingly, the instruction word 38 of FIG. 2 illustrates an operation code 40 (opcode) field of eight bits; namely, bits 0-7. The format of the instruction word 38 is illustrated having other fields 42, 44 and 46, and is a total of sixteen bits in length. In FIG. 2, the instruction word 38 will be termed "normal" insofar as the opcode field 40 completely specifies the operation to be carried out. Such operations may include, for example, load instructions, store instructions, subtract, multiply and divide.

Figure 3:
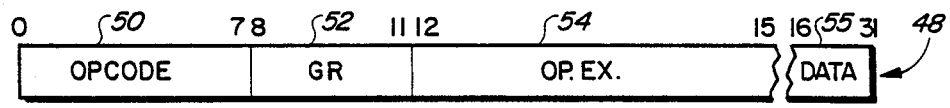

FIG. 3 is an instruction word 48 with a special format, termed an immediate long format. This format is a thirty two bit instruction consisting of an eight-bit opcode 50 with a four-bit general register field 52 that typically specifies the use of any one of sixteen general registers of the microprocessor (not shown). Field 54 is a four-bit opcode extension, and field 55 is a sixteen-bit data field. The first sixteen bits of the instruction word 48 are converted into an entry point address, while the last sixteen bits are used as data in connection with the execution of the instruction word.

Figure 4:
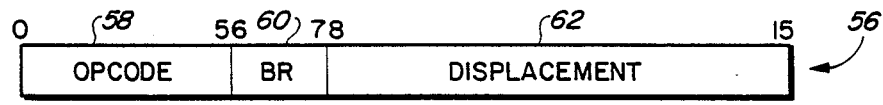

FIG. 4 is another special format instruction word 56, termed a base relative format. The base relative instruction format is a sixteen-bit instruction consisting of a six-bit opcode 58, a two-bit base register field 60 and an eight-bit displacement field 62. The base register field 60 allows the designation of one of four different registers.

Figure 5:
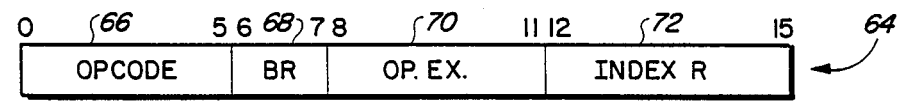

FIG. 5 is yet another special format of an instruction word 64, termed a base relative index format. This instruction format is a sixteen-bit instruction consisting of a six-bit opcode field 66, a two-bit base register field 68, a four-bit opcode extension field 70, and a four-bit index register field 72. The base register field 68 allows the designation of one of four different base registers, and the index register field 72 allows the designation of one of sixteen different index registers of the microprocessor. The foregoing instruction word formats are only exemplary of the many possible formats, and are presented to illustrate the preferred form of the invention which is shown in FIG. 6.

Figure 6:
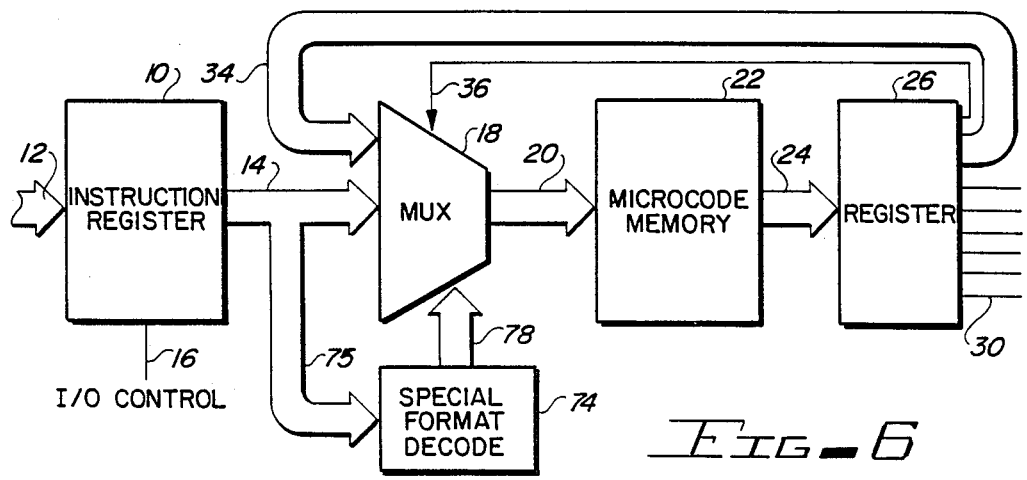
FIG. 6 is a block diagram of another embodiment of the invention adapted for decoding special instruction word formats.

The entry point address circuit depicted in FIG. 6 is substantially the same as that shown in FIG. 1, with the exception of a special instruction word format decoder 74. The special format decoder 74 has an input connected to a parallel bus 75 with lines common to instruction register output bus 14. The special format decoder 75 is provided with an output 78 coupled to a third input of the instruction word multiplexer 18. With the arrangement shown in FIG. 6, when the special format decoder 74 detects an instruction word having one of the special formats of FIGS. 3-5, circuitry within the multiplexer 18 will cause a modification of some of the instruction word bits passed to the microcode memory 22. The entry point address of special format instruction words thus comprise some original word bits, plus some artificial bits. The bit modification of special format instruction words depends on the type of instruction, and will be described more thoroughly below.

FIG. 7 is a more detailed block diagram of the instruction word multiplexer 76. Particularly, the multiplexer 18 includes a memory address row multiplexer 80 and a memory address column multiplexer 82. In the preferred form of the invention, and as noted above, the instruction words are generally sixteen bits long. The row multiplexer is presented with the sixteen-bit instruction word on bus 14, and thereafter presents eight bits of memory address row information on bus 83. In a corresponding manner, the sixteen bits of the instruction word from instruction register 10 are presented to the column multiplexer 82, whereupon the microcode memory 22 is driven by two column lines 84 to select one of four memory quadrants. While the microcode memory 22 is not actually divided into four separate quadrants, the column address lines 84 determine which one of the four lines will be addressed concurrently with the selected row lines.

In connection with the detailed description of the circuitry of the instruction word multiplexer 18, reference is had first to FIG. 8 which illustrates the symbolic nomenclature utilized in the detailed schematic of FIG. 9. The logic symbol is shown on the left, and the equivalent circuit is shown on the right of the figure. In FIG. 8, logic symbol 86 is a logic inverter with input 88 and an inverting output 90. The inverter 86 is constructed of a Schottky transistor 92 to provide the logic inversion. The solid dot 94 of the symbol represents the open collector output of the inverter. With this circuit arrangement, a logic low applied to input 88 is inverted by transistor 92, and it appears as a logic high on output 90. The converse occurs when a logic high is applied to the input 88. Pull-up resistors are provided external to the logic symbol 86 for pulling the collector of transistor 92 to a logic high level.

Logic symbol 96 is similar to that of 86, with the exception of the additional output 98. Output 98 is associated in symbolic form by a small circle. In the electrical schematic representation of the circuit of logic symbol 96, it is seen that the output 98 is coupled to the collector of transistor 92 through a diode 100. Particularly, the anode of the diode is common with the output 98, while the cathode of the diode 100 is connected to the collector of transistor 92. With this circuit arrangement, when transistor 92 conducts due to a logic high on input 88, outputs 90 and 98 will be at a logic low. Current will thus be drawn from the loads connected to outputs 90 and 98, through transistor 92 to ground. However, because other similar circuits may be connected to outputs 90 or 98, the diode 100 isolates output 90 from output 98. For example, if transistor 92 is not in its conducting state, a logic low applied by other circuitry to output 98 will not be coupled to output 90. Conversely, and because of the orientation of the diode 100, a logic low on output 90 will also pull output 98 low. It will be seen that the invention employs logic circuits similar to 96, including additional diodes and outputs connected similar to that of diode 100 and output 98. External pull-up resistors are provided for pulling the collector of transistor 92 to a logic high level.

Figure 9A:
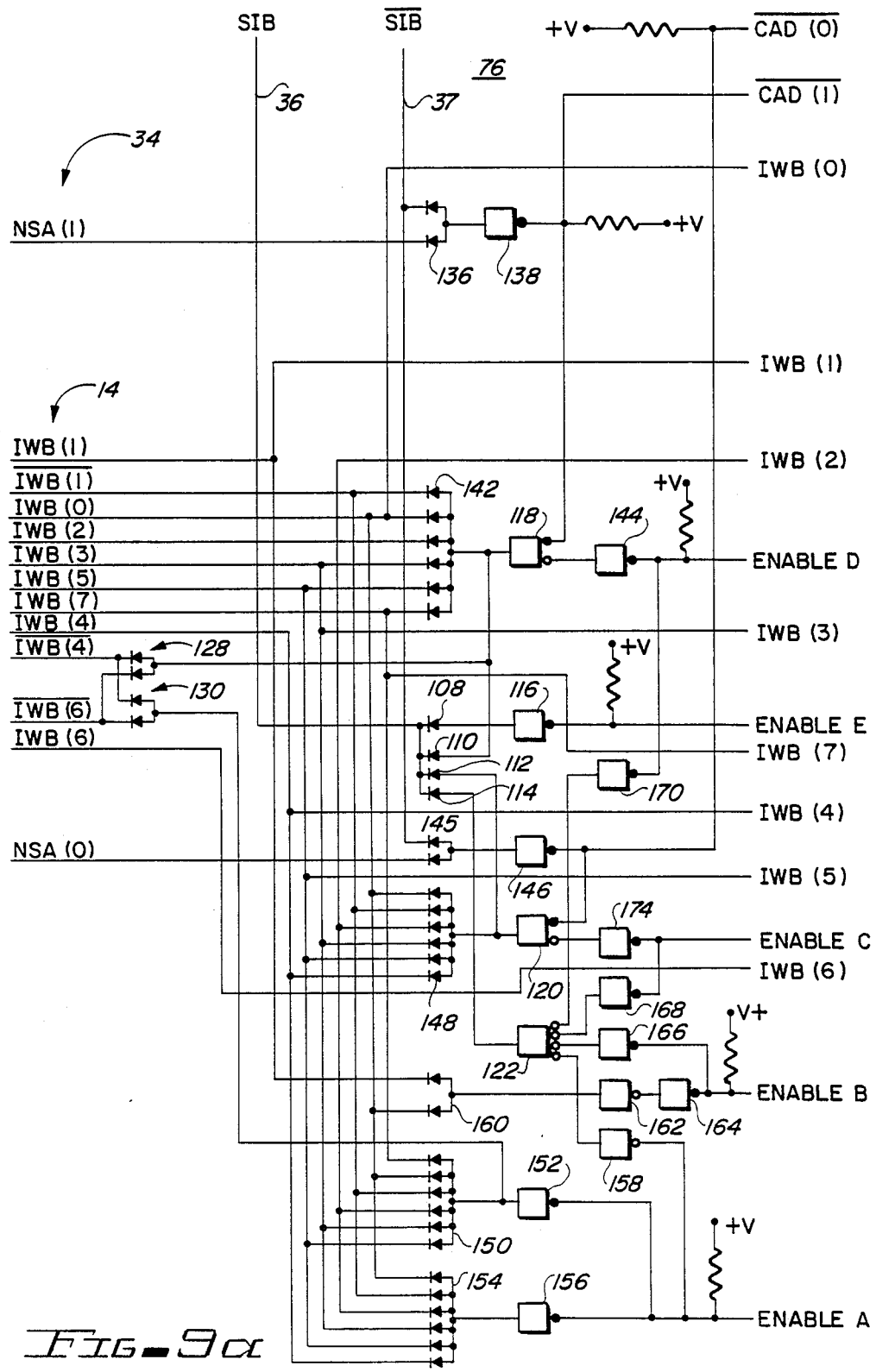
FIGS. 9a and 9b, when joined, are a detailed electrical schematic of the row and column multiplexer constructed according to the preferred embodiment of the invention.
Figure 9B:
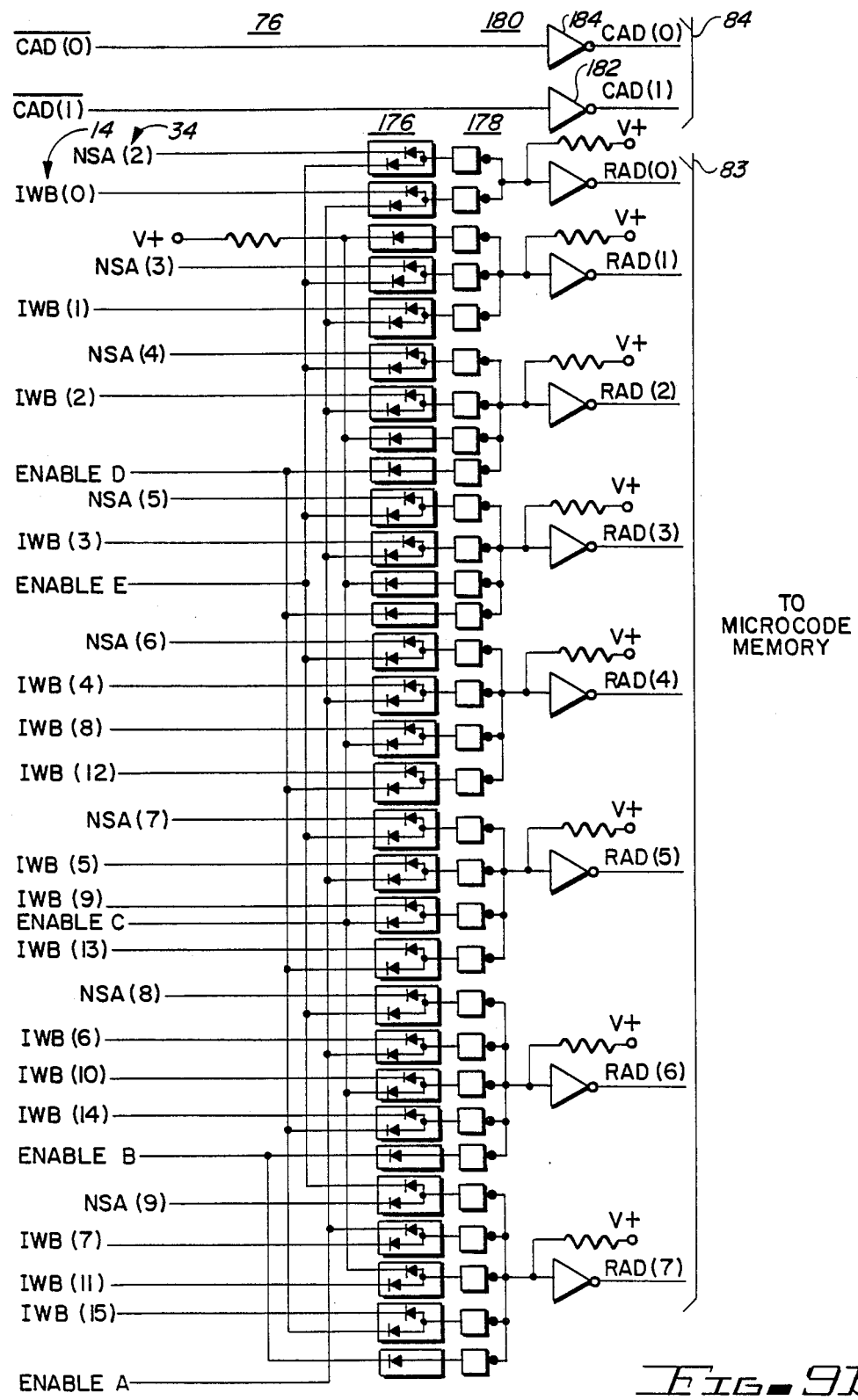

In accordance with the preferred embodiment of the invention, there is shown in FIGS. 9a and 9b the instruction word multiplexer 76 having provisions for special format decoding. It should be understood at the outset that the instruction word multiplexer 76 is described in connection with a particular application and thus it should be considered only as exemplary of the principles and concepts of the invention. Instruction word bits (IWB) zero-fifteen appear as a first input 14 to the left hand side of the multiplexer 76. In addition, the next state address bits (NSA) zero-nine provide a second input 34 to the multiplexer 76. As noted above, a select input bus (SIB) control 36 (and $\overline{SIB}$ 37) constitutes a third input to the multiplexer 76 for controlling the selection of the NSA bus 34 or the IWB bus 14. On its output, the instruction word multiplexer 76 drives a column address (CAD) bus 84, and a row address (RAD) bus 83, both directed to the microcode memory 22.

The instruction word bit inputs, namely the IWB bus 14, will be described first in connection with an instruction word of the normal format category. This type of normal instruction word format is shown in FIG. 2. For example purposes, it will be assumed that the opcode presented on IWB bus 14 has the following binary characterization: 10000000. The leftmost instruction word bit is identified with IWB(0), and the rightmost instruction word bit is identified as IWB(7). The instruction word multiplexer 76 is constructed to pass the eight opcode bits of normal instruction word formats unmodified directly to the multiplexer output bus 83. Accordingly, it will be seen from FIGS. 9a and 9b that inputs IWB(0-7) appear at respective multiplexer output sections, generally designated by inverter drivers 180.

Before the operation of the instruction word multiplexer 76 is described, the structural features of the invention will be discussed. According to the embodiment of the instruction word multiplexer 76 shown in FIGS. 9a and 9b, the select input bus control 36 is coupled to the cathodes of diodes 108-114. Each diode comprises a respective input of logic inverters 116, 118, 120 and 122. Inputs $\overline{IWB(4)}$ and $\overline{IWB(6)}$ are connected respectively to the cathodes of diode pairs 128 and 130. The anodes of diode pairs 128 and 130 are connected to the respective inputs of logic inverters 118 and 152. $\overline{SIB}$ input 37 and the input NSA(1) are connected to the cathodes of diodes 136, the anodes of which are connected to the input of logic inverter 138. The output of logic inverter 138 is connected to the input of inverter driver 182. Diode block 142 comprises six isolation diodes, each cathode of which is connected respectively to IWB(0), $\overline{IWB(1)}$, IWB(2), (3), (5) and (7). The anodes of diode block 142 are common and connected to the input of logic inverter 118. The open collector output of logic inverter 118 is connected to the input of CAD(1)

inverter driver, while the diode output of logic inverter 118 is connected to the input of a logic inverter 144.

A diode block 145 comprises two diodes, the cathode of each is respectively connected respectively to $\overline{\text{SIB}}$ input 37 and NSA(0). The common anodes of diode block 145 are connected to the input of a logic inverter 146. Diode block 148 includes six isolation diodes. The cathode of each diode of diode block 148 is connected respectively to IWB(0), $\overline{\text{IWB(1)}}$, IWB(2), (3), (4) and (5). The common anodes of diode block 148 are connected to the input of logic inverter 120. Diode block 150 includes six isolation diodes. The respective cathodes of the diodes of isolation block 150 are connected respectively to IWB(0), $\overline{\text{IWB(1)}}$, IWB(2), (3), (5) and (7). The anodes of diode block 150 are connected in common and to the input of a logic inverter 152. The input of logic inverter 152 is also connected to the common anodes of diode block 130. Diode block 154 includes six isolation diodes, each cathode of which is connected in parallel to the cathodes of isolation diode block 150, with the exception of IWB(7) which is not connected to isolation diode block 154. Rather, IWB(4) is connected to one diode cathode of isolation diode block 154. The output of isolation diode block 154 is connected to the input of a logic inverter 56. The output of logic inverters 152 and 156 are connected together, and to the output of a logic inverter 58. The outputs of logic inverters 152, 156 and 158, which are all connected together, form a conductor labeled Enable A. Enable A is responsive to a particular combination of instruction word bits for decoding a normal format instruction word (FIG. 2), or a base relative format instruction word (FIG. 4). When active, Enable A provides IWB(0–7) on multiplexer outputs RAD(0–7).

Diode block 160 comprises two isolation diodes, the cathode of each of which is connected respectively to IWB(0) and (1). The anodes of diodes within block 160 are common and are connected to the input of a logic inverter 162. The output of logic inverter 162 is connected to the input of a logic inverter 164. Logic inverter 122 is constructed with four diode outputs, one of each connected respectively to the input of logic inverters 158, 166, 168 and 170. The output of logic inverter 166 is connected to the output of logic inverter 164 which forms an Enable B conductor for decoding a base relative (FIG. 4) special format instruction word. When active, Enable B provides 11 on outputs RAD(6, 7).

Logic inverter 120 is constructed with a open collector output connected to the output of logic inverter 146, and also to the input of CAD(0) driver inverter. The diode output of logic inverter 120 is connected to the input of logic inverter 174, the output of which is connected to the output of logic inverter 16B, and the paralleled outputs of which form Enable C conductor. Enable C is active on the decoding by the multiplexer 76 of a base relative indexed (FIG. 5) special format instruction word. When active, Enable C provides 0111 IWB(8–11) on Outputs RAD(1–7).

Enable D conductor comprises the output of logic inverters 144 and 170. Enable D is used in connection with the immediate long instruction word format for outputting 0011 IWB(12–15) on RAD(2–7). Enable E is the output of logic inverter 116 and provides NSA(2–9) on multiplexer outputs RAD(0–7). The output section of the instruction word multiplexer 76 comprises a plurality of diode blocks 176, various ones of which are connected to the NSA bus 34, and others of which are connected to the IWB bus 14. In addition, the Enable A, B, C, D and E conductors are connected to the cathodes of groups of the isolation diodes 176 thereby enabling certain instruction word bits in accordance with the normal or special format, or enabling the NSA bits. The anodes of the isolation diodes in blocks 176 are connected to one of a plurality of logic inverters 178. There are eight groups of logic inverters 178, the outputs of each group thereof are connected in common and to one of a plurality of respective inverter drivers 180. The eight inverter drivers 180 which are coupled respectively to the eight groups of logic inverters 178 comprise row address drivers (RAD) for the microcode memory. The RAD (0–7) output bus is denoted by reference character 83. Column address inverter drivers 182 and 184 drive the column address driver (CAD) bus 84 extended to the microcode memory.

The functional features of the instruction word multiplexer 76 are best understood by referring to FIG. 10, along with FIGS. 9a and 9b. FIG. 10 illustrates the multiplexer output as a function of the various enable leads, as well as the state of the select input bus lead 36. For example, when SIB is driven low as shown by row 186 of the table, Enable A–D are at logic low levels, while Enable E is at a logic high. The appropriate output isolation diodes 176 will be enabled so as to pass NSA(2–9) to the output 83 of the instruction word multiplexer 76. In this mode, the next state input address bus 34 is selected for addressing the microcode memory 22. When SIB input 36 is low (and SIB input 37 is high), CAD(0) corresponds to NSA(0), and CAD(1) corresponds to NSA(1).

Row 188 of the table of FIG. 10 indicates that when SIB input 36 and Enable A are at logic highs, IWB(0–7) of the input bus 14 will be selected and will be coupled directly to the output row address bus 83 for addressing the microcode memory 22. This corresponds to normal format instruction words. CAD(0,1) equals 00.

Row 190 of the table shows that when SIB input 36, Enable A and Enable B are at logic highs, the base relative special instruction word format is decoded. Instruction word bits IWB(0–5) are then selected for outputting. Logic highs are forced on RAD (6, 7). CAD (0,1) equals 00.

Row 192 indicates the decoding of the base relative index special instruction word format when SIB input 36 and Enable C are both high, whereby RAD(0–3) outputs logic signals 0111, and RAD(4–7) outputs the selected bits IWB(8–11). CAD (0,1) equals 10.

Row 194 of the table depicts yet another instruction word format (immediate long) which is decoded when SIB input 36 and Enable D are both high. In this event, RAD(0–3) outputs the logic levels respectively of 0011, and RAD(4–7) output respective bits IWB(12–15). CAD (0,1) equals 01.

By analyzing the circuit of FIGS. 9a and 9b, it will be realized that certain combinations of the instruction word bits (0–7) will cause Enable A conductor to be driven to a logic high level to thereby transfer IWB-(0–7) directly to the multiplexer output 83. This is considered the normal instruction word format. It will be realized that Enable A conductor will be high for the normal and base relative instruction word formats indicated in rows 188 and 190 of the FIG. 10 table.

It will further be seen from an analysis of the instruction word multiplexer 76 that when IWB(0,1) are at a logic high, irrespective of the logic state of IWB(2–5), Enable B will be driven high. At this time SIB input 36 is also driven to a logic high. Moreover, when IWB(1)

is a logic high, Enable A will be high to select the special instruction word format shown in row 190 of the table. Similarly, when the multiplexer 76 decodes IWB-(0-7) as logic states 101111XX, Enable C will be driven high, corresponding to the special instruction word format shown in row 192 of the table. It is to be understood that the "X" is a don't care. In a corresponding manner, when the instruction word multiplexer 76 decodes IWB(0-7) as logic states 10110101, the special instruction word format decoded will correspond to that of row 194 of the table.

It should be noted that the multiplexer 76 is constructed so that for each combination or permutation of bits forming the instruction word on bus 14, appropriate enable leads will be driven high. Thus, no ambiguity exists in the instruction word multiplexer 76 as to which instruction word corresponds to a normal or a special format. It should also be noted that for each special instruction word format 190, 192 and 194 of the table, the column addresses CAD (0,1) select a different memory section.

Because the normal instruction word format, denoted by row 188 of FIG. 10, is passed through the multiplexer 76 only in the absence of special format instruction words, the decoding of the latter will be specifically described. The conductor Enable B becomes active when the special format instruction word 190 is decoded by the multiplexer 76. With reference to FIGS. 9a and 9b, when IWB(0,1) are at logic high levels, the isolation diodes 160 are reverse biased, whereby a logic high is applied to the input of inverter 162. Accordingly, the output of inverter 164 is also at a logic high, provided the output of inverter 166 is also high. This is the case as it is assumed that the selection input bus SIB control 36 is at a logic high, thereby selecting the input instruction word bus 14. Thus, the input of logic inverter 122 is high and all the outputs thereof are at logic lows. The output of inverter 166 is then at a logic high thereby driving Enable B conductor high. With the intermediate inversion of inverters 178, logic lows are provided to the input of driver inverters RAD(6,7). The output of these inverter drivers are thus at logic highs corresponding to row 190 of the FIG. 10 table.

In addition, with this special instruction word format, Enable A conductor is also driven high to provide IWB(0-7) bits at the RAD(0,7) multiplexer outputs. Since with this special instruction word format $\overline{IWB(1)}$ is at a logic low, one diode each of isolation blocks 150 and 154 is forward biased. Accordingly, the outputs of logic inverters 152 and 156, and thus Enable A, is at a logic high. The output of logic inverter 158 is also at a logic high. It is seen that the Enable A conductor is coupled to various isolation diode blocks 176 such that IWB(0-5) are coupled directly to the logic inverters 178, and thus also to the inputs of inverter drivers 180 corresponding to RAD(0-5). The special instruction word format 190 of the FIG. 10 table is thereby coupled to the microcode memory 22 as an entry point address. Enable B overrides Enable A into the inverters 178 which drive outputs RAD(6,7) to logic high levels.

The column addresses for the microcode memory are determined in the following manner. $\overline{SIB}$ input control 37 forward biases one diode of block 136 and applies a low to the input of logic inverter 138. Inverter 138 couples a logic high to the input of inverter driver 182, provided the open collector output of inverter 118 is also at a logic high. This is the case as the logic of $\overline{IWB(1)}$ is applied to the input of logic inverter 118, the output of which is a logic high. Therefore, a logic high will be applied to the input of column address of inverter driver 182. The output of inverter driver 182 drives column address conductor CAD(1) to the memory 22 with a logic low. The logic low of the selection input bus control $\overline{SIB}$ 37 is inverted once before being applied to column address CAD(0) inverter driver 184. $\overline{SIB}$ input control 37 is inverted by logic inverter 146. Accordingly, CAD(0,1) is applied to the microcode memory 22 as logic states 00. It is seen that column address CAD(0) undergoes gate delays of only two logic gates; namely, inverter 146 and driver 184. Column address CAD(1) undergoes a similar delay with inverter 118 and driver 182. A minimum delay in generating the column addresses of the microcode memory 22 is thus achieved. This is extremely beneficial in compensating for the inherently longer period of time in which it may take the memory 22 to decode column addresses. As a result, in considering the different delays incurred in generating and decoding row addresses and column addresses, the overall address delay in the multiplexer and memory are brought into correspondence.

Without detailing the various logic inverters involved in decoding the special instruction word format 192 of the FIG. 10 table, it is sufficient to understand that the output of logic inverter 174 is driven to a logic high, thereby providing a multiplexer output of RAD(0-7) equal to 0111 IWR(8-11). A different section of the microcode memory 22 will also be addressed with column addresses CAD(0,1)=10. It is seen that the bits (8-11) of the opcode extension field of the instruction word are passed to the microcode memory 22 as part of the entry point address.

In a similar manner, when the special instruction word format corresponding to row 194 of the FIG. 10 table is decoded by the instruction word multiplexer 76, Enable D conductor is driven to a logic high. When this special instruction word format is processed by the multiplexer 76, the microcode memory 22 will be addressed with row addresses RAD(0-7) equal to 0011 IWB(12-15). With this special instruction word format, the column address CAD(0,1) will equal 01, and thus a different memory section will be accessed. In all of the foregoing, it should be realized that in initially programming the microcode ROM 22, it is necessary to correlate the starting point in the memory with the entry point address for carrying out the instruction function.

From the foregoing, a highly efficient instruction word multiplexer generates entry point addresses to the microcode memory without being clocked or decoded by a conventional PLA, and thus without incurring unnecessary delays. It is seen that by using Schottky clamped logic, very few gate delays are involved in presenting entry point addresses to the microcode memory. Moreover, special instruction word formats are accommodated by detecting the various patterns of the special formats at the multiplexer input, and enabling various output gates of the multiplexer to provide the desired pattern of bits for entry point addresses corresponding to the special format.

It should be understood that the foregoing exemplifies the principles and concepts of the invention when applied to the instruction word formats noted in FIG. 10. However, those skilled in the art may apply the concepts of the invention to construct other multiplexers responsive to other instruction word formats.

While the preferred embodiment of the method and apparatus has been disclosed with reference to specific construction, it is to be understood that many changes in the detail may be made as a matter of engineering choices without departing from the scope of the invention as defined by the appended claims. Also, it is not necessary to adopt all of the various advantages and features of the present invention into a single composite multiplexer in order to realize the individual advantages.

What is claimed is:

1. An entry point address circuit for producing microcode ROM addresses for a ROM from plural input bits, said ROM decoding said ROM addresses into row addresses and column addresses, each of said ROM addresses including a first group of bits from which said ROM will decode said row addresses and including a second group of bits from which said ROM will decode said column addresses, said ROM decoding said column addresses slower than said row addresses, said circuit comprising:
   A. a first group of gates for producing said first group of bits from at least part of said plural input bits, said first group of gates including plural levels of sequential gates between said input bits and said ROM addresses; and
   B. a second group of gates for producing said second group of bits from at least part of said input bits, said second group of gates including plural levels of sequential gates fewer than said levels of said first group of gates.

2. The circuit of claim 1 in which said second level of gates has two levels of sequential gates.

3. An entry point address circuit for producing microcode ROM addresses from parallel input bits of plural formats, said circuit comprising:
   A. input leads receiving said input bits in a certain bit order;
   B. outputs leads carrying each said produced ROM address in a certain order of parallel bit positions;
   C. a decoder circuit connected to said input leads and producing form said input bits at least one of several different enable signals to indicate the format of the input bits received on said input leads;
   D. a multiplexer circuit connecting selected ones of said input leads to different order bit positions of said output leads in response to receipt of each said at least one enable signal; and
   E. said input leads including input leads for an instruction word, for next state addresses and for a select input bus signal, and said decoder circuit including gating for producing one enable signal in response to said select input bus signal and producing the other enable signals in response to the format of said instruction word.

4. The circuit of claim 3 in which said decoder produces at least one enable signal for input bit formats of at least a next state address, normal, base relative, base relative index and immediate long.

5. The circuit of claim 3 in which there are a first group of said output leads producing one of row and column addresses to said ROM and a second group of said output leads producing the other of said row and column addresses to said ROM, and said multiplexer connecting selected ones of said input leads to different order bit positions of one of said first and second groups of output leads.

6. The circuit of claim 5 in which said first group of output leads produces row addresses and said multiplexer connects selected ones of said input leads to different order bit positions of said first group of output leads.

7. The circuit of claim 3 in which each of said ROM addresses from said output leads includes a first group of bits from which said ROM will decode one of row addresses and column addresses and includes a second group of bits from which said ROM will decode the other of said row addresses and column addresses, said ROM decoding one of said row and column addresses slower than the other and decoding the other of said row and column addresses faster than the one, said decoder and multiplexer circuits having sequential levels of gates arranged to have fewer levels of gates to produce said group of bits that said ROM decodes slower than the level of gates to produce said group of bits that said ROM decodes faster.

8. The circuit of claim 3 in which said decoder circuit connects to only a part of said input leads.

* * * * *